(12) United States Patent
Yudovsky et al.

(10) Patent No.: US 11,530,480 B2
(45) Date of Patent: Dec. 20, 2022

(54) INJECTOR FOR BATCH PROCESSING AND METHODS OF USE

(71) Applicant: Applied Materials, Inc., Santa Clara, CA (US)

(72) Inventors: Joseph Yudovsky, Campbell, CA (US); Kevin Griffin, Livermore, CA (US); Mandyam Sriram, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/666,881

(22) Filed: Feb. 8, 2022

(65) Prior Publication Data

US 2022/0162748 A1 May 26, 2022

Related U.S. Application Data

(62) Division of application No. 15/184,617, filed on Jun. 16, 2016, now Pat. No. 11,261,525.

(60) Provisional application No. 62/182,359, filed on Jun. 19, 2015.

(51) Int. Cl.
*C23C 16/455* (2006.01)

(52) U.S. Cl.
CPC .. *C23C 16/45502* (2013.01); *C23C 16/45546* (2013.01); *C23C 16/45563* (2013.01)

(58) Field of Classification Search
None
See application file for complete search history.

(56) References Cited

U.S. PATENT DOCUMENTS

| 8,968,476 B2 | 3/2015 | Shin et al. |
| 2010/0186669 A1 | 7/2010 | Shin et al. |
| 2015/0020737 A1 | 1/2015 | Lee |
| 2015/0147889 A1 | 5/2015 | Yudovsky et al. |

FOREIGN PATENT DOCUMENTS

| CN | 101768731 A | 7/2010 |
| KR | 10-2010-0128864 A | 12/2010 |
| KR | 10-2013-0139651 A | 12/2013 |
| KR | 101394122 B1 | 5/2014 |
| WO | 2014127363 A1 | 8/2014 |

OTHER PUBLICATIONS

"Machine Translation of KR 101394122", 27 pgs.
"PCT International Preliminary Report on Patentability in PCT/US2016/037867 dated Dec. 28, 2017, 10 pages".
"PCT International Search Report and Written Opinion in PCT/US2016/037867 dated Nov. 9, 2016, 13 pages".

*Primary Examiner* — Joel G Horning
(74) *Attorney, Agent, or Firm* — Servilla Whitney LLC

(57) ABSTRACT

Apparatus and methods for processing a substrate including an injector unit, comprising a leading reactive gas port extending along a length of the injector unit, a trailing reactive gas port extending along the length of the injector unit, and a merge vacuum port forming a boundary around and enclosing the leading reactive gas port and the trailing reactive gas port.

11 Claims, 6 Drawing Sheets

INJECTOR FOR BATCH PROCESSING AND METHODS OF USE

CROSS-REFERENCE TO RELATED APPLICATIONS

This application is a divisional of U.S. patent application Ser. No. 15/184,617, filed Jun. 16, 2016, which claims priority to U.S. Provisional Application No. 62/182,359, filed Jun. 19, 2015, the entire disclosures of which are hereby incorporated by reference herein.

TECHNICAL FIELD

Embodiments of the present disclosure relate generally to apparatus and methods for depositing thin films. In particular, embodiments of the disclosure are directed to atomic layer deposition batch processing injectors and methods of use.

BACKGROUND

In carousel-type Atomic Layer Deposition (ALD) batch processing chambers, a substrate is sequentially exposed to various reactive gases in separate portions of the processing chamber. This ALD process is often referred to as spatial ALD because the reactive gases are separated spatially within the processing chamber rather than temporally.

In some processes, a segment of the spatial ALD processing chamber provides plasma exposure to the substrate. The exposure time to plasma segments is the same as that of the thermal deposition segments. In some processes, the film formation may benefit from increased plasma exposure time than thermal exposure time. Therefore, there is a need in the art for apparatus and methods for increasing the plasma exposure in a spatial ALD batch processing chamber.

SUMMARY

One or more embodiments of the disclosure are directed to injector units comprising a leading reactive gas port extending along a length of the injector unit; a trailing reactive gas port extending along the length of the injector unit, and a merge vacuum port forming a boundary around and enclosing the leading reactive gas port and the trailing reactive gas port.

Additional embodiments of the disclosure are directed to processing chamber comprising a circular gas distribution assembly. The gas distribution assembly has an inner peripheral edge and an outer peripheral edge. The gas distribution assembly comprises two first injector units and two second injector units arranged so that the first injector units and second injector units alternate. Each of the first injector units comprise a first reactive gas port extending along a length of the first injector unit, a first vacuum port surrounding the first reactive gas port, a first purge gas port adjacent a side of the first vacuum port, a second reactive gas port extending along a length of the first injector unit, and a second vacuum port surrounding the second reactive gas port. Each of the second injector unit comprises a leading reactive gas port extending along a length of the injector unit, a trailing reactive gas port extending along a length of the injector unit, and a merge vacuum port forming a boundary enclosing a mixed process region including the leading reactive gas port and the trailing reactive gas port. The processing chamber includes a susceptor assembly which has a top surface facing the circular gas distribution assembly. The top surface has a plurality of recesses therein, with each recess sized to support a substrate during processing.

Further embodiments of the disclosure are directed to processing methods comprising placing a substrate having a substrate surface into a processing chamber comprising gas distribution assembly including a plurality of injector units. At least a portion of the substrate surface is exposed to a first reactive gas from a first reactive gas port surrounded by a first vacuum port. The substrate surface is laterally moved through a gas curtain. At least a portion of the substrate surface is exposed to a second reactive gas from a second reactive gas port surrounded by a second vacuum port. The substrate surface is laterally moved through a gas curtain. At least a portion of the substrate surface is exposed to a mixed process region enclosed within a merge vacuum port. The mixed process region comprises a leading reactive gas from a leading reactive gas port and a trailing reactive gas from the trailing reactive gas port. The substrate surface is laterally moved through a gas curtain.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways. It is also to be understood that the complexes and ligands of the present disclosure may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

Figure 1:
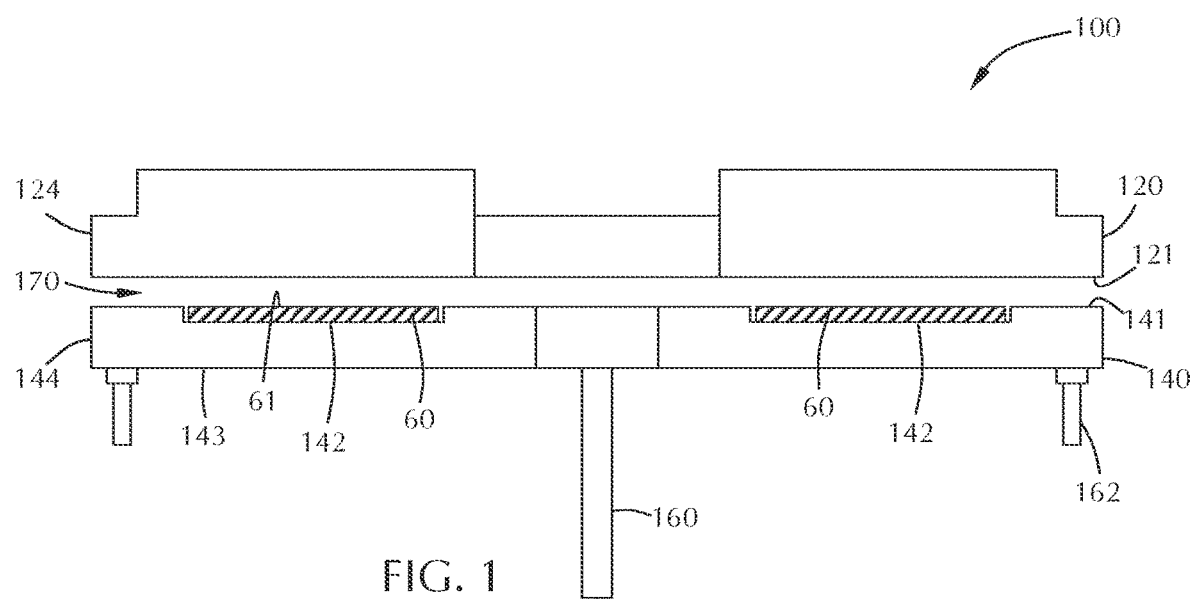
FIG. 1 shows a cross-sectional view of a batch processing chamber in accordance with one or more embodiment of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of gas channels. The plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
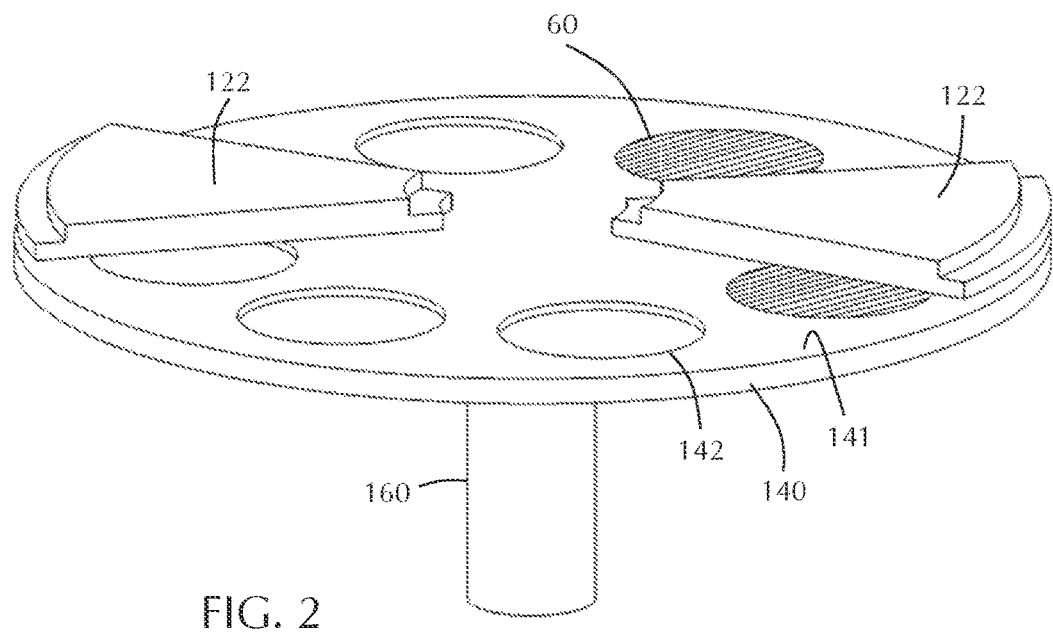
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.5 mm, ±0.4 mm, ±0.3 mm, ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
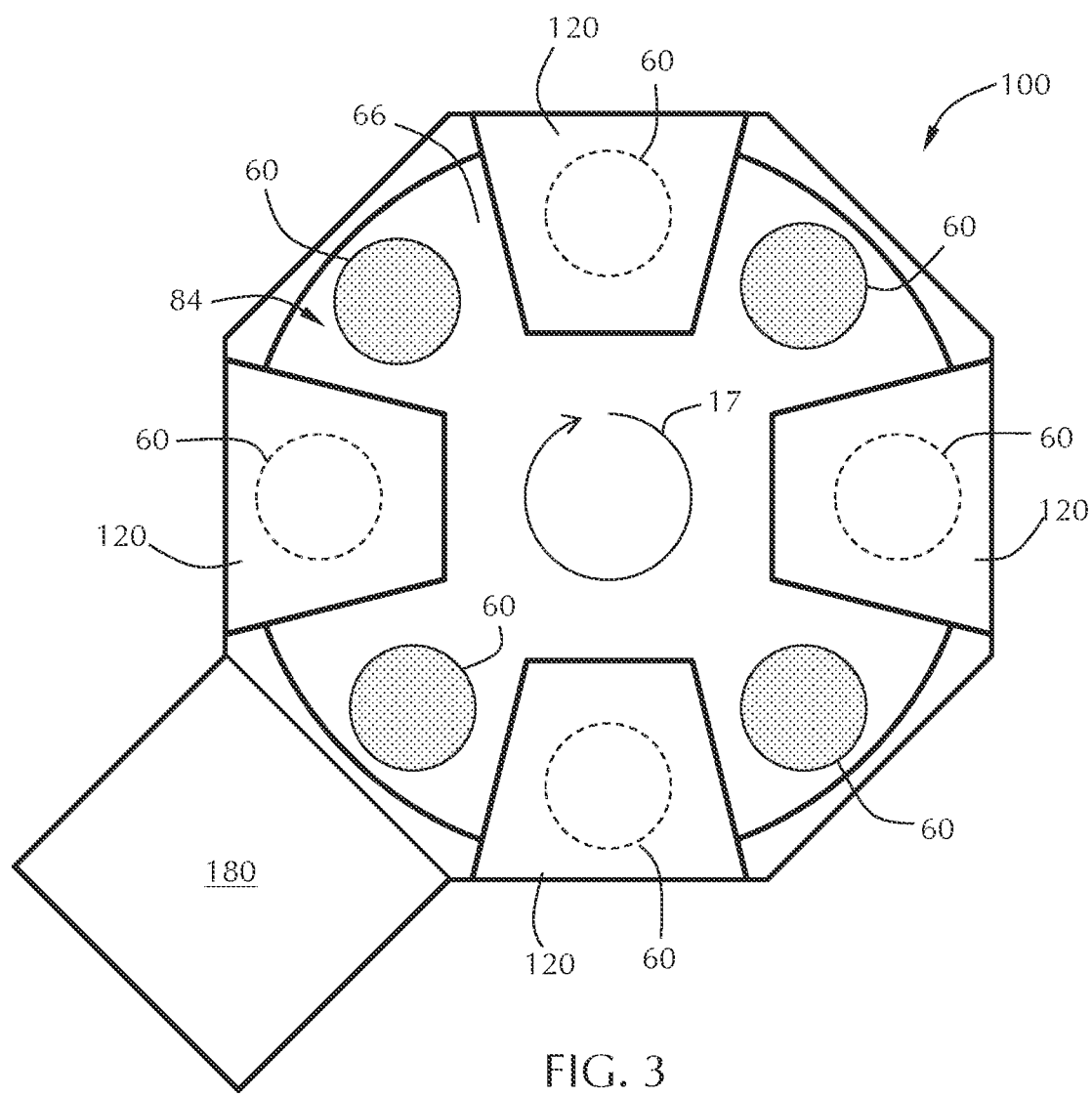
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between injector assemblies 120 to be moved to an injector assembly 120 for film deposition, as illustrated by the dotted circle under the injector assemblies 120. An additional 45° rotation would move the substrates 60 away from the injector assemblies 30. With spatial ALD injectors, a film is deposited on the wafer during movement of the wafer relative to the injector assembly. In some embodiments, the susceptor assembly 140 is rotated in increments that prevent the substrates 60 from stopping beneath the injector assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
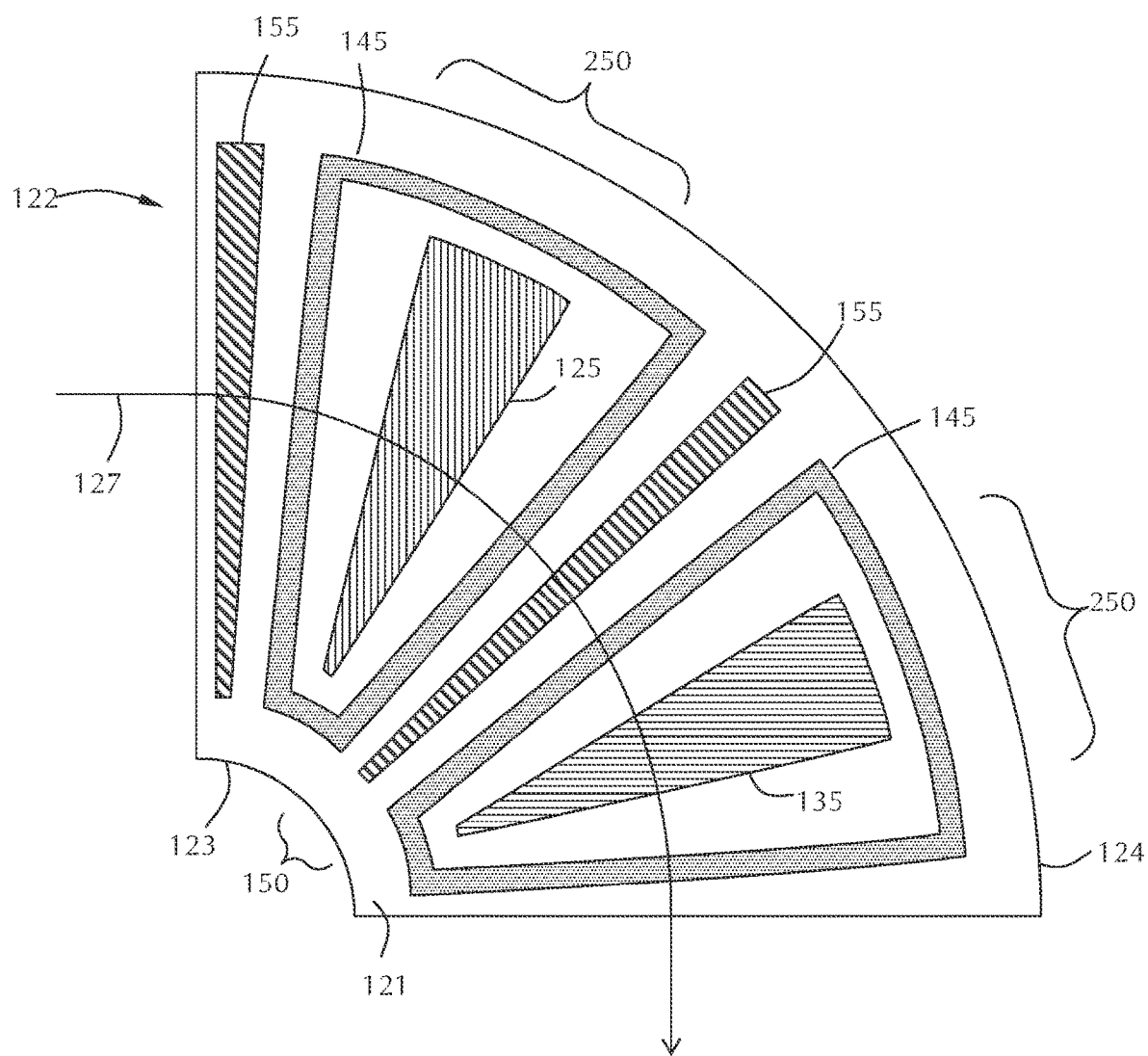
FIG. 4 shows a schematic view of a portion of a wedge shaped gas distribution assembly for use in a batch processing chamber in accordance with one or more embodiment of the disclosure.
Figure 5:
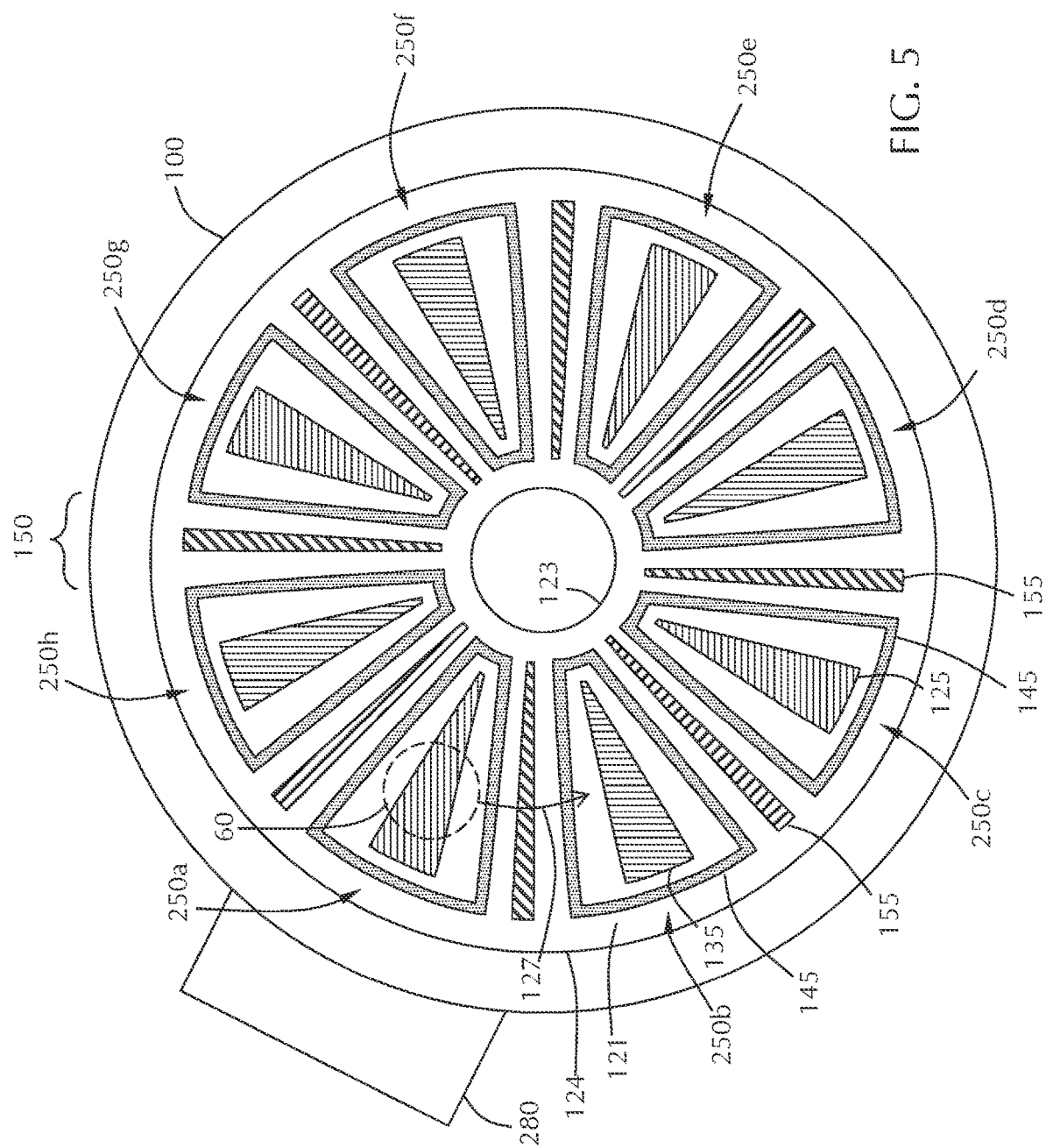
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to gas streams from the first reactive gas port 125 and the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120 (also referred to as a gas distribution plate). The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between. For each cycle around the processing chamber, using the gas distribution assembly shown, the substrate 60 will be exposed to four ALD cycles of first reactive gas and second reactive gas.

The conventional ALD sequence in a batch processor, like that of FIG. 5, maintains chemical A and B flow respectively from spatially separated injectors with pump/purge section between. The conventional ALD sequence has a starting and ending pattern which might result in non-uniformity of the deposited film. The inventors have surprisingly discovered that a time based ALD process performed in a spatial ALD batch processing chamber provides a film with higher uniformity. The basic process of exposure to gas A, no reactive gas, gas B, no reactive gas would be to sweep the substrate under the injectors to saturate the surface with chemical A and B respectively to avoid having a starting and ending pattern form in the film. The inventors have surprisingly found that the time based approach is especially beneficial when the target film thickness is thin (e.g., less than 20 ALD cycles), where starting and ending pattern have a significant impact on the within wafer uniformity performance. The inventors have also discovered that the reaction process to create SiCN, SiCO and SiCON films, as described herein, could not be accomplished with a time-domain process. The amount of time used to purge the processing chamber results in the stripping of material from the substrate surface. The stripping does not happen with the spatial ALD process described because the time under the gas curtain is short.

Accordingly, embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions. For example, if region 250a had no reactive gas flow, but merely served as a loading area, the processing chamber would have seven processing regions and eight gas curtains.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250b through processing region 250h, an inert gas would be flowing into processing region 250a. The inert gas can be flowed through the first reactive gas port 125 or the second reactive gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Figure 6:
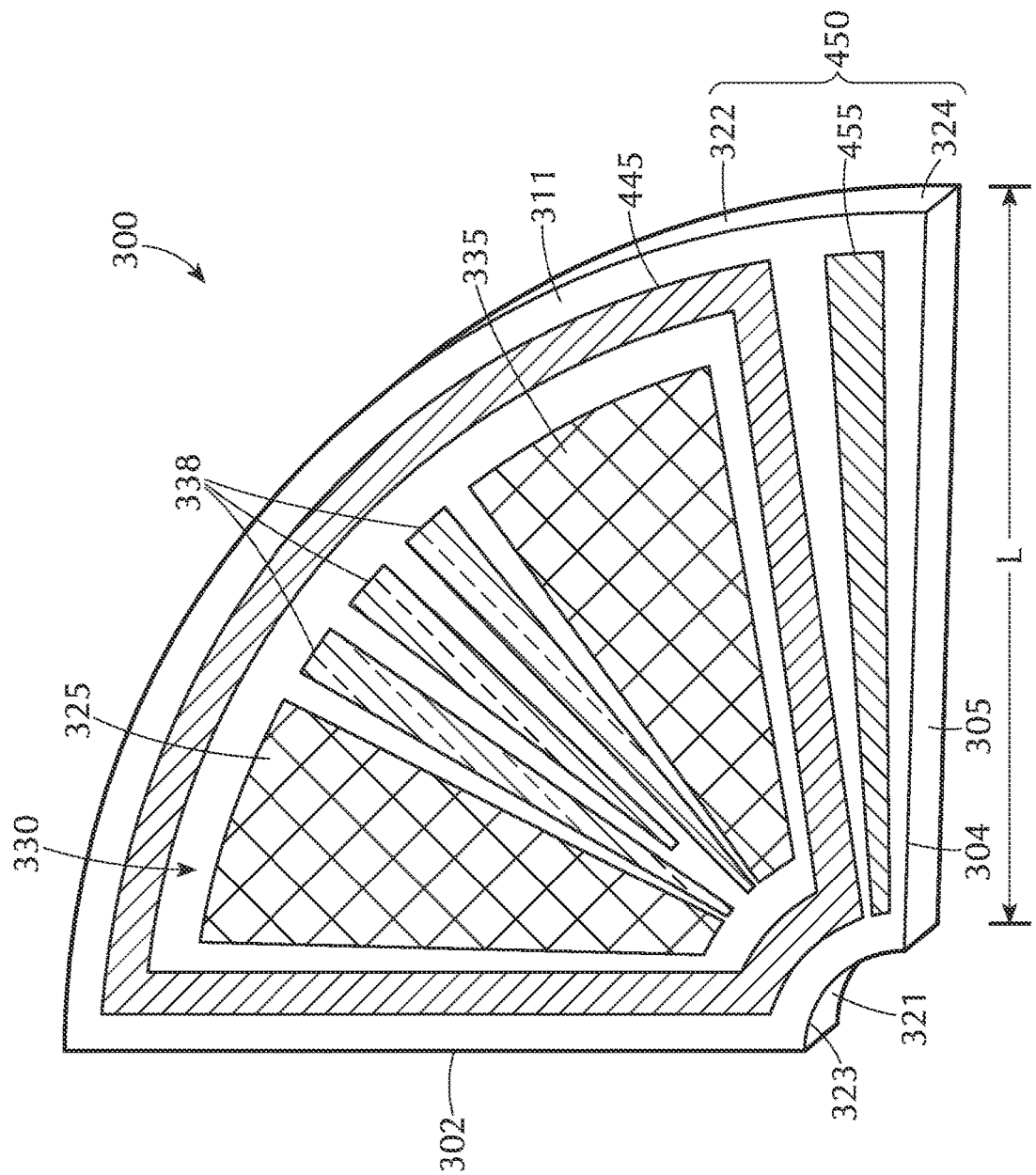
FIG. 6 shows an injector unit in accordance with one or more embodiments of the disclosure.

FIG. 6 shows another embodiment of an injector unit 300. The injector unit 300 can be integrally formed or mechanically fastened to other injector units of the same configuration or different configurations (e.g., injector unit 122 shown in FIG. 4) to form a complete circular component or can be modular to replace individual injector units or sectors of existing gas distribution assemblies. As shown, the injector unit 300 has a leading edge 302 and a trailing edge 304. The leading edge can have a first face (not shown) that is similar to the second face 305 of the trailing edge 304.

The injector unit 300 includes an inner peripheral edge 323 with an inner peripheral face 321 and an outer peripheral edge 324 with an outer peripheral face 322. The inner peripheral edge 323 and the outer peripheral edge 324 connect the leading edge 302 and the trailing edge 304 to form the sector or wedge shape. The inner peripheral edge 323 and outer peripheral edge 324 define a length L of the injector unit 300. The arc between the leading edge 302 and the trailing edge 304 define a width which can vary based on the position along the length L measured. For example, the width of the injector unit 300 is greater near the outer peripheral edge 324 than near the inner peripheral edge 323.

The injector unit shown is truncated so that there is no point at the inner region where the leading edge 302 and the trailing edge 304 meet. In some embodiments, the leading edge 302 and the trailing edge 304 meet at a point so that there is no inner peripheral face 321. When referring to the inner peripheral edge of a component without an inner peripheral face 321, the region adjacent the point where two radii of the circle or ellipse (i.e., the leading edge 302 and trailing edge 304) come together. The angle formed by the leading edge 302 and the trailing edge 304 depends on the size of the injector unit 300. The angle formed by the leading edge 302 and the trailing edge 304 of injector unit 300 shown is about 90°. Thus, if four injector units 300 as shown were connected end-to-end, a complete circle would be formed. In some embodiments, the injector unit 300 forms a portion of a circle so that the leading edge and trailing edge form an angle in the range of about 20° to about 180°, or in the range of about 25° to about 35°, or in the range of about 50° to about 60°, or in the range of about 60° to about 120°, or in the range of about 70° to about 110° or in the range of about 80° to about 100°, or in the range of about 85° to about 95°.

The injector unit 300 includes a leading reactive gas port 325 which extends along the length L of the injector unit 300. Those skilled in the art will understand that the gas ports described as extending along the length of the sector can extend along any portion of the length of the sector and are not limited to the entire length of the sector. As used in this regard, the terms leading and trailing are used to distinguish the reactive gas ports only. Additional gas ports with reactive gases or inert gases can be in front of the leading reactive gas port 325 or after the trailing reactive gas port 335 without deviating from the spirit of the disclosure. Each of the reactive gas ports described has an opening in the face 311 of the injector unit 300 that can be an open slot, open wedge shape or have a diffuser or other flow diverter.

A merge vacuum port 445 forms a boundary around and encloses at least the leading reactive gas port 325 and the trailing reactive gas port 335. The merge vacuum port 445 forms a mixing zone 330 which allows gases from the leading reactive gas port 325 and the trailing reactive gas port 335 to mix within the boundary of the mixing zone 330 while preventing the gases from diffusing out of the boundary formed by the merge vacuum port 445. The number of reactive gas ports located within the merge vacuum port 445 can be greater than or equal to two, three, four, five, six, seven, eight, nine, 10, 11, 12, 13, 14 or more. The size of the individual reactive gas ports can be varied and the size of the merge vacuum port 445 can be varied to enclose some or all of the reactive gas ports in the individual injector unit 300. In some embodiments, the combination of reactive gas ports within the merge vacuum port 445 occupy greater than or equal to about 50% of the area enclosed by the merge vacuum port 445. In some embodiments, the combination of reactive gas ports within the merge vacuum port 445 occupy greater than or equal to about 60%, 70%, or 80% of the area enclosed by the merge vacuum port 445.

The shape of the gas ports can vary depending on, for example, the shape of the injector unit 300. In the injector unit 300 shown in FIG. 6, the gas ports are wedge shaped. In some embodiments, the gas ports are conformal in shape with the injector unit 300. As used in this regard, the term "conformal in shape", and the like, used to describe the shape of a gas port relative to another gas port or an injector unit means that the overall shape of the named components are similar shapes or aspect ratios. In some embodiments, the merge vacuum port 445 is conformal in shape with the injector unit 300. Additionally, as shown in FIG. 6, the merge vacuum port 445 may be conformal in shape with the combination of the leading and trailing gas ports.

Figure 7:
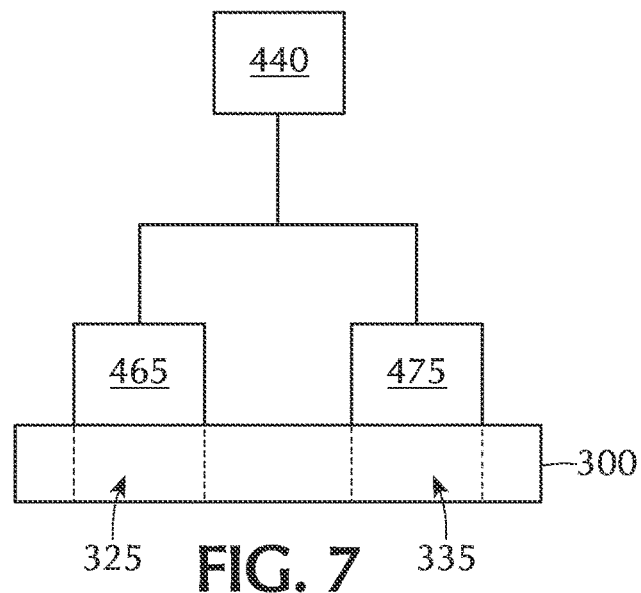
FIG. 7 shows a side view of an injector unit in accordance with one or more embodiments of the disclosure.

FIG. 7 shows a side view of the injector assembly 300 with the leading reactive gas port 325 and trailing reactive gas port 335 shown in phantom. In some embodiments, there is at least one remote plasma source connected to one or more of the leading reactive gas port 325 or the trailing reactive gas port 335. In the embodiment shown in FIG. 7, there is a leading remote plasma source 465 connected to the leading reactive gas port 325 and a trailing remote plasma source 475 connected to the trailing reactive gas port 335. While both of the remote plasma sources are shown connected to a single power supply 440, those skilled in the art will understand that there can be more than one power supply.

Referring back to FIG. 6, some embodiments include a purge gas port 455 adjacent one side of the merge vacuum port 445. The purge gas port 455 shown ensures that there is a purge gas stream between the injector unit 300 and any other unit which may be positioned adjacent the trailing edge 304 of the injector unit 300. The purge gas port 455 in conjunction with the trailing portion of the merge vacuum port 445 and any purge or vacuum ports on an adjacent injector unit for a gas curtain 450 to prevent gases from the mixing zone 330 from diffusing into other regions of the processing chamber.

In some embodiments, at least one intermediate gas port 338 is positioned between the leading reactive gas port 325 and the trailing reactive gas port 335 within the boundary of the merge vacuum port 445. The embodiment shown in FIG. 6 has three intermediate gas ports 338 but other numbers of gas ports can be used. The intermediate gas ports 338 can be connected to and in fluid communication with one or more of the leading reactive gas port 325 and/or trailing reactive gas port 335. In some embodiments, the intermediate reactive gas ports 338 are connected to a different gas and can flow either an inert gas or a reactive gas into the mixing zone 330. The intermediate gas ports 338 can occupy any amount of the mixing zone 330 depending on the size and shape of the individual reactive gas ports. In some embodiments, the intermediate gas ports 338 occupy in the range of about 10% to about 60% of the mixing zone area. In some embodiments, the intermediate gas ports 338 occupy in the range of about 20% to about 50%, or 25% to about 40% or about 25% to about 35%, or about 30% of the area of the mixing zone 330. In various embodiments, the intermediate gas ports 338 occupy up to about 90%, 80%, 70%, 60% or 50% of the mixing zone.

In accordance with one or more embodiments, the same reactive gas is flowed into both the leading reactive gas port 325 and the trailing reactive gas port 335 and, optionally, the at least one intermediate gas port 338. The gas is able to flow into the mixing zone 330 so that a relatively large processing region is formed. In some embodiments, a different gas is flowed through the intermediate gas port 338 which can be either inert or reactive. In this way, a small portion of the ALD processing chamber can be setup for CVD type processing so that two reactive gases are flowing into the mixing zone 330 at the same time.

In another embodiment, the reactive gas flowing into the leading reactive gas port 325 and the trailing reactive gas port 335 flow through at least one remote plasma source so that a plasma flows into the mixing zone 330. In some embodiments, the reactive gas is flowed through the intermediate gas ports 338 either as a neutral gas or as plasma.

In one or more embodiments, the reactive gas flowing into the leading reactive gas port 325 is different from the reactive gas flowing into the trailing reactive gas port 335. The different gases can be inert relative to the other gas or can be reactive with the other gas so that a CVD reaction can occur in the mixing zone 330.

Figure 8:
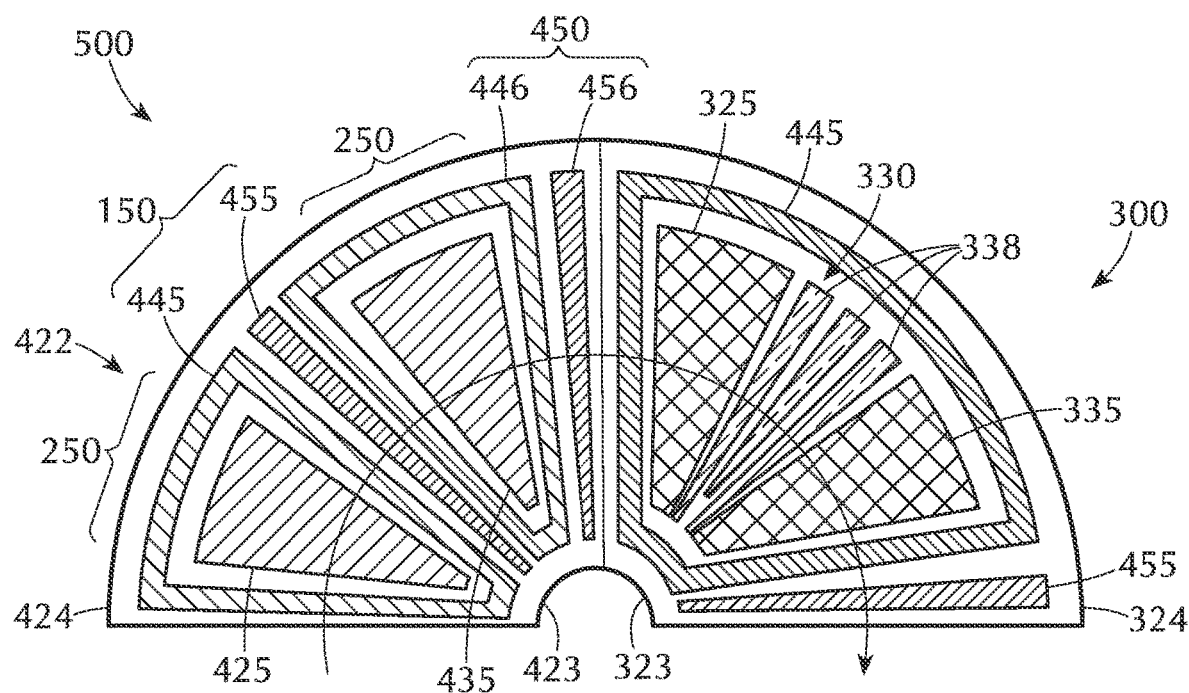
FIG. 8 shows a partial gas distribution assembly combining the injector units of FIG. 4 and FIG. 8 into one half of a gas distribution assembly.

FIG. 8 shows one half of a gas distribution assembly 500 in accordance with one or more embodiments of the disclosure. The other half of the gas distribution assembly 500 can be the same as that shown rotated 180° or can have a different combination of injector unit configurations. The gas distribution assembly 500 includes at least one first injector unit 422 having an inner peripheral edge 423 and an outer peripheral edge 424 defining a length of the first injector unit 422.

Each of the first injector units 422 comprises a first reactive gas port 425 extending a length of the injector unit 422. A first vacuum port 445 surrounds the first reactive gas port 425 on both sides and the inner and outer periphery. A first purge gas port 455 is adjacent a side of the first vacuum port 445 and extends along the length of the injector unit 422. A second reactive gas port 435 extends along a length of the injector unit and has a second vacuum port 446 surrounding.

A second purge gas port 456 can be positioned at either or both ends of the first injector unit 422. In the embodiments shown, the second purge gas port is shown at the end of each of the different configuration injector units. Stated differently, some embodiments further comprise a purge gas port 456 between each of the first injector units 422 and the second injector units 300.

In some embodiments, there are two first injector units 422 and two second injector units 300 arranged in an alternating configuration so that a substrate rotated adjacent a face of the gas distribution assembly 500 will be exposed to, in order, a vacuum stream, a first reactive gas from the first reactive gas port 425, a vacuum stream, a purge gas, a vacuum stream, a second reactive gas from the second reactive gas port 435, a vacuum stream, a purge gas, a vacuum stream, a leading reactive gas from the leading reactive gas port 325, a trailing reactive gas from the trailing reactive gas port 335 and a vacuum stream. As used in this regard, a vacuum stream is a flow of gas being drawn from the processing chamber by application of a vacuum source to the vacuum port.

In one or more embodiments, during constant rotation (i.e., at constant speed) of the susceptor assembly, a substrate positioned thereon will be exposed to the mixed processing region for a time greater than or equal to twice an amount of time that the substrate is exposed to a first reactive gas from the first reactive gas port 425, or the time that the substrate would be exposed to a second reactive gas from the second reactive gas port 435. In some embodiments, the substrate is exposed to the mixing zone for a time greater than or equal to about 2.5, 3 or 3.5 times the amount of time that the substrate is exposed to either the first reactive gas port or the second reactive gas port.

One or more embodiments are directed to processing methods. A substrate having a substrate surface is placed in the processing chamber. In some embodiments, the substrate is placed into a recess in the surface of a susceptor so that during rotation of the susceptor, the substrate remains in a fixed position.

At least a portion of the substrate surface is exposed to a first reactive gas from a first reactive gas port 425 surrounded by a first vacuum port 445. The substrate is laterally moved through the gas curtain 150 to a different portion of the processing chamber. At least a portion of the substrate surface is exposed to a second reactive gas from a second reactive gas port 435 surrounded by a second vacuum port 446. The substrate is laterally moved through gas curtain 450 to another region of the processing chamber. At least a portion of the substrate surface is expose to a mixed process region (or mixing zone 330) enclosed within a merge vacuum port 445. The mixed process region comprises a leading reactive gas from a leading reactive gas port 325 and a trailing reactive gas from the trailing reactive gas port 335. The substrate is then laterally moved through a gas curtain 450 to continue processing or be removed from the processing chamber.

In the mixing zone 330, the substrate is exposed to one or more of a single reactive species, a combination of reactive species (e.g., a CVD) process, a single plasma species, a combination of plasma species, or a combination of reactive species and plasma species. An inert gas or carrier gas can always be present in any of the sectors or process regions and can be co-flowed or mixed with the reactive species.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
    laterally moving a substrate surface through a gas curtain to a mixed region of a processing chamber; and
    exposing at least a portion of the substrate surface a mixed process region enclosed within a merge vacuum port of an injector unit, the mixed process region comprising a leading reactive gas from a leading reactive gas port, a trailing reactive gas same as the leading reactive gas from a trailing reactive gas port, and an intermediate reactive gas different from the first reactive gas and second reactive gas from at least one intermediate gas port positioned in the mixing zone between the leading reactive gas port and the trailing reactive gas port, the at least one intermediate gas port occupying in the range of about 10% to about 60% of an area of the mixed process region,
    wherein a combination of the reactive gas ports within the merge vacuum port occupy greater than or equal to about 50% of the area enclosed within the merge vacuum port.

2. The processing method of claim 1, wherein the merge vacuum port acts as a boundary that allows gases from the leading reactive gas port and the trailing reactive gas port to mix within the boundary while preventing the gases from diffusing out of the boundary.

3. The processing method of claim 1, wherein the injector unit has a leading edge and a trailing edge defining a width of the injector unit and an inner peripheral edge and an outer peripheral edge connecting the leading edge and trailing edge and defining a length of the injector unit.

4. The processing method of claim 3, wherein the injector unit forms a portion of a circle so that the leading edge and trailing edge form an angle in the range of about 60° to about 120°.

5. The processing method of claim 1, wherein one or more of the leading reactive gas or the trailing reactive gas comprise a plasma from at least one remote plasma source connected to one or more of the leading reactive gas port or the trailing reactive gas port.

6. The processing method of claim 1, further comprising a leading remote plasma source connected to the leading reactive gas port and a trailing remote plasma source connected to the trailing reactive gas port.

7. The processing method of claim 1, further comprising a purge gas port adjacent one side of the merge vacuum port.

8. The processing method of claim 1, wherein the at least one intermediate gas port is in fluid communication with one of the leading reactive gas port and the trailing reactive gas port.

9. The processing method of claim 1, wherein the at least one intermediate gas port is in fluid communication with a different gas than the leading reactive gas port and the trailing reactive gas port.

10. The processing method of claim 1, further comprising:
    exposing at least a portion of the substrate surface to a first reactive gas from a first reactive gas port surrounded by a first vacuum port in a first region of the processing chamber;
    laterally moving the substrate surface through a gas curtain to a second region of the processing chamber; and
    exposing at least a portion of the substrate surface to a second reactive gas from a second reactive gas from a second reactive gas port surrounded by a second vacuum port in the second region of the processing chamber.

11. The processing method of claim 10, wherein the substrate surface is moved in a circular motion adjacent a circular gas distribution assembly having an inner peripheral edge and an outer peripheral edge, the gas distribution assembly comprising two first injector units and two second injector units arranged so that the first injector unit and second injector unit alternate, each first injector unit comprising a first reactive gas port extending along a length of the first injector unit, a first vacuum port surrounding the first reactive gas port, a first purge gas port adjacent a side of the first vacuum port, a second reactive gas port extending along a length of the first injector unit and a second vacuum port surrounding the second reactive gas port, each second injector unit comprising the mixed process region within the merge vacuum port of claim 1.

* * * * *